United States Patent [19]
Dietrich et al.

[11] Patent Number: 4,828,664
[45] Date of Patent: May 9, 1989

[54] PROCESS FOR THE PRODUCTION OF A NIOBIUM OXYCARBONITRIDE SUPERCONDUCTING FIBER BUNDLE

[75] Inventors: Manfred Dietrich, Karlsruhe; Cord-Heinrich Dustmann, Weinheim; Franz Schmaderer, Heidelberg; Georg F. H. Wahl, Eppelheim, all of Fed. Rep. of Germany

[73] Assignees: Brown, Boveri & Cie AG, Mannheim; Kernforschungszentrum Karlsruhe GmbH, Essenstein-Leopoldshafen, both of Fed. Rep. of Germany

[21] Appl. No.: 30,708

[22] Filed: Mar. 25, 1987

Related U.S. Application Data

[62] Division of Ser. No. 677,176, Dec. 3, 1984, Pat. No. 4,657,776, which is a division of Ser. No. 518,381, Jul. 29, 1983, Pat. No. 4,521,289.

[30] Foreign Application Priority Data

Jul. 31, 1982 [DE] Fed. Rep. of Germany ....... 3228729
Oct. 6, 1982 [DE] Fed. Rep. of Germany ....... 3236896

[51] Int. Cl.$^4$ .............................................. C23C 14/00
[52] U.S. Cl. .................................. 204/192.24; 505/816
[58] Field of Search .................... 204/192.24; 427/62; 505/816, 818

[56] References Cited

U.S. PATENT DOCUMENTS 4,279,969 7/1981 Francavilla et al. ........... 204/192.24
4,426,268 1/1984 Cukavskas ..................... 204/192.24

OTHER PUBLICATIONS

Francavilla et al., *IEEE Transactions on Magnetics*, vol. Mag-17, No. 1, Jan. 1981, p. 569.
Gavaler et al., *J. Vac. Sci. Techn.*, vol. 10, No. 1, Jan.-/Feb. 1973, p. 17.
Gavaler, *IEEE Transactions on Magnetics*, vol. MAG-15, No. 1, Jan. 1979, p. 623.

*Primary Examiner*—Norman Morgenstern
*Assistant Examiner*—Margaret Burke
*Attorney, Agent, or Firm*—Herbert L. Lerner; Laurence A. Greenberg

[57] ABSTRACT

Superconducting fiber bundle which contains a multiplicity of carrier fibers such as, for instance, carbon fibers, boron fibers, steel fibers coated with a superconducting layer of a niobium compound of the general formula $NbC_xN_yO_z$ (x+y+z less than or equal to 1), characterized by the feature that the superconducting layer consists of fine-grained B1-structure niobium compound, the mean grain size of which is between 3 and 50 nm.

8 Claims, 4 Drawing Sheets

PROCESS FOR THE PRODUCTION OF A NIOBIUM OXYCARBONITRIDE SUPERCONDUCTING FIBER BUNDLE

This is a division of application Ser. No. 677,176, filed Dec. 3, 1984, now U.S. Pat. No. 4,657,776, which is a divisional of Ser. No. 518,381, filed July 29, 1983, now U.S. Pat. No. 4,581,289.

BACKGROUND OF THE INVENTION

1. Field of the Invention

The invention relates to a method of manufacturing a superconducting fiber bundle which contains a multiplicity of carrier fibers such as carbon fibers, boron fibers, steel fibers, etc. coated with a superconducting layer of a niobium carbonitride compound.

2. Description of the Prior Art

In the further development of power technology in view of nuclear fusion and superconducting generators, traffic engineering (magnetic suspension railroad), environment engineering (coal disulfurization) and high energy physics, strong-field magnets are required which can be manufactured economically only on the basis of superconductors.

A new promising superconducting material is, for instance, $NbC_xN_yO_z$ ($x+y+z$ less than or equal to 1), which applied to carrier fibers of a fiber bundle (number of fibers is arbitrary), can be used as a fiber conductor. Niobium oxycarbonitride as well as in particular niobium carbonitride in which $z=0$, are distinguished by high critical temperatures, high critical magnetic fields and high critical current densities. Any suitable material can be used as the carrier fiber material (for instance C, B, steel) which has the necessary mechanical strength. It serves as a high-tensile strength matrix and as a substrate for a chemical gaseous phase deposit method (CVD=chemical vapor deposition), in which niobium is deposited by reaction of $NbCl_5$ with $H_2$ in the presence of carbon and nitrogen-containing gases as a thin film. The CVD process is carried out either in a a single stage (simultaneous Nb-deposition and carbonitration) or in two stages (Nb-deposition and carbonitration following each other in time).

From German Published Prosecuted Application DE-AS No. 28 56 885, a 2-stage CVD method has become known which is carried out at gas pressures higher than or equal to normal pressure. In principle, the layers that can be produced by this method are still too coarse grained to achieve optimum superconductor properties. The attainable grain sizes of the niobium carbonitride crystals are 50 to 100 nm.

Superconduction parameters such as the upper critical magnetic field strength $H_{C2}$ depend, in addition to the usual influences such as composition, degree of order, purity and similar things, particularly on the metallurgical grain structure. A reduction of the grain size is followed, because of the reduction connected therewith of the free path length of the conduction electrons, by an increase of the Ginsburg-Landau parameter k (k=coherence length/magnetic penetration depth) and, since $H_{C2}$ is proportional to k . $H_C$ ($H_C$: thermodynamic critical magnetic field strength), an increase of the magnetic field $H_{C2}$ in the thermodynamic critical field $H_C$ does not increase to the same extent in this grains size reduction. In the case of niobium oxycarbonitride, the thermodynamic properties, particularly the thermodynamic critical field $H_C$, do not react sensitively to a further reduction as a consequence of a grain size reduction, because of their already small free path length of the conduction electrons in this substance (as also in other B1 structure superconductors) an increase of the magnetic field $H_{C2}$ follow from a reduction of the grain size.

It was possible to demonstrate this increase of the critical magnetic field strength $H_{C2}$ due to grain size reduction by means of cathode sputtering by which thin niobium oxycarbonitride films were applied to plane carriers (J. R. Gavaler et al, IEEE Transactions on Magnetics, Volume MAG-17, No. 1, January 1981, Pages 573–576). However, it has not been possible so far to coat fibers of a carrier fiber bundle with superconducting niobium oxycarbonitride with grain sizes of less than 50 nm. As was mentioned, only layers, the grain size of which was more than 50 nm, could be produced by CVD methods. The cathode sputtering method on the other hand has a preferred direction, so that the problem of mutual shading of the individual fibers of the carrier fiber bundle arises. Due to this insufficient throwing power, uniform coating of the individual fibers has not been possible so far. Plane superconductors, however, can be used technically only with great reservations because the eddy currents generated in the ribbons by transversal components of the magnetic field never decay and thereby contribute to electrical instabilities in the ribbon conductor. Otherwise, a reduction of the grain size is desirable in view of increasing the critical current density $J_C$, since the grain boundaries form very effective adhesion centers for the magnetic flux lines.

SUMMARY OF THE INVENTION

It is an object of the invention to provide methods for manufacturing the superconducting fiber bundles of the type mentioned at the outset, through which a homogeneous coating on all sides of the individual fibers of the fiber bundle is achieved, while the superconducting layer has high values for the critical magnetic field and the critical current density.

In accordance with the invention, there is provided a method for manufacturing a superconducting fiber bundle formed of a multiplicity of carrier fibers coated with a superconducting layer of a niobium compound selected from the group consisting of niobium oxycarbonitride of the general formula $NbC_xN_yO_z$ wherein $x+y+O_z$ is equal to or less than 1, said superconductive layer of niobium compound having a fine grained B1-structure and a mean grain size between 3 and 50 nm which comprises fanning-out a carrier fiber bundle into a carrier fiber ribbon, coating the carrier fibers on all sides with niobium compound by reactive cathode sputtering, in the presence of nitrogen or nitrogen compound and carbon or a carbon compound, and annealing the carriers fiber ribbon to aid in the deposit of the niobium compound in a polycrystalline structure.

There is provided in accordance with the invention a method for manufacturing a superconducting fiber bundle formed of a multiplicity of carrier fibers coated with a superconducting layer of a niobium compound selected from the group consisting of niobium oxycarbonitride of the general formula $NbC_xN_yO_z$ wherein $x+y+z$ is equal to or less than 1, said superconductive layer of niobium compound having a fine grained B1-structure and a mean grain size between 3 and 50 nm which comprises fanning out a carrier fiber bundle into a carrier fiber ribbon, coating the fanned-out carrier fibers on all sides under a controlled temperature with niobium compound in amorphous form by reactive cathode sputtering, using a sintered niobium oxycarbontride target for the exact dosing of the non-metallic compound partners $O_2$, $N_2$ or C, and subsequently the amorphous niobium compound to a heat treatment to convert it into the fine-grained B1-structure.

Other features which are considered as characteristic for the invention are set forth in the appended claims.

Although the invention is illustrated and described herein as embodied in a superconducting fiber bundle and method for manufacturing same, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will e best understood from the following description when read in connection with the accompanying drawings, in which.

DETAILED DESCRIPTION OF THE INVENTION

Figure 1:
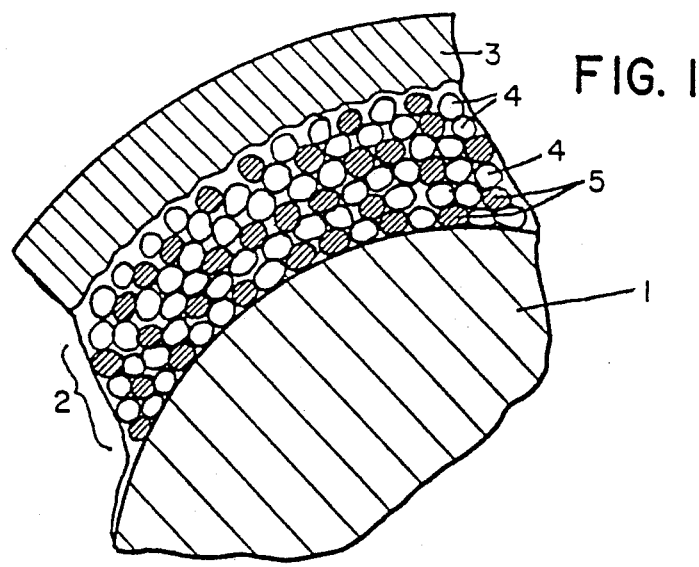
FIG. 1 illustrates part of a coated carrier fiber in a cross-sectional view showing the surface of the carrier fiber covered with superconducting grains of B1-structure niobium compound crystals with a grain size between 3 and 50 nm and grains of insulating material such as $NbO_2$, and the grains covered by a copper layer.

A microstructure of the niobium oxycarbonitride in B1-structure (rock-salt structure) with a mean grain size of between 3 and 50 nm is particularly advantageous because of the small free path length connected therewith and as was described, the high critical magnetic field strength $H_{C2}$ resulting therefrom.

Niobium oxycarbonitride which has a mean grain size above 50 nm does not meet the requirement for obtaining very large magnetic fields, since the critical magnetic field strength $H_{C2}$ as well as the critical current density $J_C$ are not sufficient. In crystal structures, on the other hand, the mean grain size of which is less than 3 nm, an X-ray structure analysis is no longer possible because of the limited resolution. Beyond this, the crystalline and thereby also the superconducting properties disappear with decreasing grain size. An advantageous typical mean grain size for superconducting layers of fiber bundles may, for instance, be around 10 nm.

Preferably, the layer thickness of the superconducting layer is between 100 and 2,000 nm. Such layer thicknesses can be prepared with the method described in the following and ensure the necessary current carrying capacity of the fiber bundle. It has been found that the elasticity of thin, fine-grained layers is higher than that of the thicker and more coarse-grained layers.

The superconducting layer is preferably coated with a highly conductive metal layer, for instance of high-purity copper or aluminum, which can take up the current in the possible event of a failure of the superconducting properties (stabilization). An increase of the current carrying capacity can be achieved by building-in pinning centers. These are inhomogeneities in the superconducting material in the order of the coherence length of about 5 nm which differ substantially from the superconductive material with respect to the electrical properties. Grain boundaries are such suitable pinning centers so that the described reduction of the grain size has an advantageous effect on the current carrying capacity. This applies in any case as long as the $H_{C2}$ value and therewith the electric resistivity of the superconducting grains is low, so that the electric resistivity within the grain is large as compared to the conductivity of the grain boundaries. With the presently achieved $H_{C2}$ values, this difference of the conductivity is no longer ensured, since the mean-free path length of the electrons have reached so small a value in the grain that the mentioned condition (grain conductivity height as compared with the conductivity of the grain boundary) is no longer met.

Therefore, various structures of the superconducting layer according to the invention are proposed which show an increase of the difference of the conductivity in the grain and at the grain boundary:

1. For reducing the conductivity of the grain boundary it is advantageous to make the superconducting layer such that occlusions of insulating material are contained, uniformly distributed, between the B1-structure niobium oxycarbonitride grains. These occlusions act as pinning centers (pinning grains). The size of the pinning grains is in the order of magnitude of the coherence length of about 5 nm. Their concentration may amount to 50% of the superconducting layer. Insulating material of interest, are for instance, oxides like $ZrO_2$, $TiO_2$, $NbO_2$ or carbides such as SiC, NbC or nitrides like TiN.

2. A particularly distinct difference of the conductivity between the grain and the grain boundary is provided according to a further advantageous embodiment of the invention, if in the superconducting layer, occlusions of insulating material are deposited at all grain boundary surfaces of the superconducting grains regardless of the spatial orientation of the grain boundary surfaces. Such a skin of insulating material at the grain boundary surfaces of the superconducting grain has, for instance, a layer thickness of 2 to 5 nm. It is pinning-effective since the normal-conducting core of the flux tubes can be anchored well in the insulating material.

3. It is further advantageous to deposit occlusions of insulating material only at the grain boundaries of the superconducting grains which have a given spatial orientation within the superconducting layer. This relates to a multilayer structure of the superconducting layer, in which superconducting material and insulating material alternate. Although the pinning-effect in such a stratification depends on the orientation of the magnetic field relative to the strata, it is nevertheless found that through preparing such a stratification an advantageous grain reduction of the superconducting grains can be obtained since the growth of the superconducting grains is always interrupted by the deposition of the insulating layer. The superconducting and insulating layers may be parallel to the surface of the respective carrier fiber. The material an layer thickness correspond to the structure examples described under points 1 and 2.

4. A further advantageous modification of the superconducting layer is provided if the superconductive material contains, besides niobium oxycarbonitride, a further element which increases the electric conductivity of the superconducting grain without substantial change of the $H_{C2}$ value. Also thereby, the difference of the electric conductivity between grain and grain boundary is increased. Tantalum Ta or titanium Ti may, for instance, be used as alloy material.

Particularly advantageous are superconducting layers in which, in addition to the reduction of the electric conductivity of the grain boundaries by occlusions of insulating material, the conductivity of the superconducting grains is increased by the addition of suitable elements, so that large differences of the conductivity between grain and grain boundary result.

A method for producing superconducting fiber bundles according to the invention has not become known to date. The known CVD processes (for instance German Published Prosecuted Application DE-AS No. 28 56 885) while they allow homogeneous coating of entire fiber bundles, the attainable grain sizes of the niobium carbonitride crystals are only about 50 to 100 nm and the superconducting layer thicknesses have, as a rule, values of less than 100 nm, too thin to ensure sufficient current carrying capacity.

Although it is possible to by known physical methods such as reactive cathode atomization (sputtering) to produce an extremely fine microstructure, these methods have a preferred direction for the coating, i.e. the back side of a substrate is reached only unsatisfactorily, so that layers can be applied only on plane substrates. Heretofore, it has not been possible to coat fiber bundles with, for instance, 1000 individual fibers homogeneously, because the inner fibers of the bundle are shaded by the outer fibers.

For the manufacture of superconducting fiber bundles according to the invention, one can start out from a method in which in a CVD reactor, the niobium oxycarbonitride, particularly the niobium carbonitride, is deposited by means of chemcial deposition from the gaseous phase through reaction of niobium chloride, carbon and nitrogen compounds on the carrier fiber. This can be done on the basis of different known methods. One can start, for instance, from a single-stage as well as a two-stage CVD process (German Published Prosecuted Application DE-AS No. 28 56 885). These methods have the advantage of allowing homogeneous coating of entire fiber bundles. According to the invention, the deposition is accomplished from the gaseous phase, using plasma activation and/or under the action of an ultrasonic field which can be generated in the CVD reactor by an inserted ultrasound source which puts the gas in vibration. Surprisingly, plasma activation as well as the action of ultrasonic fields in CVD processes, especially in the preparation of niobium oxycarbonitride layers using a CVD process, lead to a considerable reduction of the grain sizes, which can apparently be explained by disturbances of the growth processes and increased formation of seeds.

J. R. Hollahan and A. T. Bell have described in "Techniques and Application of Plasma Chemistry", New York, 1974, the application of plasmas in chemistry (plasma activation or gas plating) and, among other things, the action of plasmas in CVD processes. The objective of the methods explained was to make possible CVD processes by a plasma activation, or to lower the process temperature. A reference to grain size reduction by plasma activation or even a suggestion for utilizing such a grain size reduction in the preparation of superconducting layers, however, is missing. It has furthermore been found that in the method according to the invention, the deposition rate can be increased several times by plasma activation. By the example of titanium diboride deposition from $TiCl_4$ and $BCl_3$ it was found by T. Takahashi, H. Itch, Journal of Crystal Growth, Volume 49 (1980), pages 445–450, that the fine graininess of the titanium diboride is increased by the ultrasonic action in the CVD process. There, the substrate was applied on a vibrator and set in vibration. The object of the investigations was to increase the surface hardness of steel tools coated with titanium diboride. The application of this relatively new process to the manufacture of superconductors, particularly of superconducting fiber bundles which cannot be fastened to a vibrator, has not become known from this publication because of the very different objective.

The CVD method according to German Published Prosecuted Application DE-AS No. 28 56 885 is carried out at pressures which are higher than or equal to normal pressure in order to avoid contaminations from penetrating into the deposition apparatus. However, it has been found that the use of underpressure offers substantial advantages. Thus, with underpressure, the coatability of complicated bodies, therefore also the coatability of fibers can be increased, so that in particular, very good coating success has been achieved, especially in fiber bundles with many filaments. Total gas pressures between 0.1 and 1000 mbar have been found to be advantageous. If there are no locks to the outside in the coating apparatus, the flow of impurities from the outside air can be avoided. If the deposition of niobium oxycarbonitride is carried out in the presence of a plasma (plasma activation), a total pressure of between 0.1 and 5 mbar is preferably set because plasmas are easier to ignite at low pressure.

In order to place different occlusions of insulating material into the superconducting layer, the described CVD process can be modified. Thus, it is advantageous for producing occlusions according to the structures described under point 1 and 2, if the insulating material is deposited from the gaseous phase simultaneously with the niobium oxycarbonitride deposition. By setting the process parameters such as partial pressures, temperature, coating duration, etc., the grain size of the superconducting grains as well as the thickness of the insulating occlusions can be adjusted. For producing a layerwise structure of the superconducting layer, in which superconducting and insulating layers alternate (see structure according to point 3), the deposition of the insulating material can be carried out likewise in the CVD reactor for the niobium oxycarbonitride deposition. The insulating material can be deposited here alternatingly with the niobium oxycarbonitride from the gaseous phase so that the substrate (carrier fiber) is covered in a manner of onion skins by the superconducting and the insulating layers.

Instead of this alternating deposition, a procedure can be also used for producing a multilayer structure such that during a continuous CVD deposition of niobium oxycarbonitride insulating material is deposited intermittently from the gaseous phase onto the substrate, i.e. with interruptions in time.

For increasing the electric conductivity, the superconducting grains of B1-structure niobium oxycarbonitride may contain besides niobium, carbon, nitrogen and oxygen, a further element which increases the conductivity such as tantalum or titanium.

In order to produce such as alloy, one of the CVD processes described can be modified such that the element increasing the conductivity can be deposited in the CVD reactor simultaneously with the niobium oxycarbonitride deposition.

The fiber coating in the manufacture of superconducting fiber bundles according to the invention may also be based, in spite of problems mentioned initially, on physical vapor deposition method through embodiments according to the invention (for instance sputter processes, reactive sputter processes, ion plating). Such methods are described for instance, in K. L. Chopra, "Thin Film Phenomena", New York, 1969. The manufacturing process according to the invention provides that a carrier fiber bundle is fanned out into a carrier fiber ribbon, and that one-sided or two-sided coating of the carrier fiber ribbon with niobium oxycarbonitride follows through cathode sputtering, particularly reactive cathode sputtering, of niobium in the simultaneous presence of nitrogen or of a nitrogen compound and carbon or a carbon compound, where the carrier fiber ribbon is optionally annealed to deposit the niobium oxycarbonitride in polycrystalline form.

Some of the numerous modifications of the cathode sputtering method will be listed by way of example in the following:

There are to be distinguished diode or triode arrangements depending on whether the plasma is ignited automatically or whether it needs an additional electron source. D-c voltage as well as high frequency a-c voltage can be used. The same fanned-out fiber arrangement also makes possible plasma-activated and reactive evaporation processes. In summary it can be stated that all methods are suitable which permit influencing the growth kinetics in a programmed manner, be it via the temperature of the substrate, or be it via the kinetic energy of the reactants (plasma activation or partial gas pressures).

For influencing the growth kinetics, the carrier fiber can advantageously be annealed immediately before or during the coating by infrared radiation. The substrate can also be annealed, for instance, to 60°–70° C. The temperature can be controlled by infrared sensors.

To improve the good superconducting properties of the superconducting layer and also its mechanical properties, a modified process can be used in which the carrier fiber bundle is fanned-out into a carrier fiber ribbon. This is followed by a coating on all sides of the carrier fibers with the niobium oxycarbonitride by reactive cathode sputtering. The thermal conditions, particularly the temperature of the carrier fibers, are set to deposit the niobium oxycarbonitride in amorphous form. A sintered niobium oxycarbonitride target is used for exact dosing of the non-metallic compound partners $O_2$, $N_2$ and C. The amorphous superconducting layer is converted by a heat treatment following the deposition (for instance heating to 600° to 800° C.) into a fine grained B1-structure. By this method, complete freedom from texture (grains show no preferred orientation of any kind) can be achieved, wherefrom particularly good mechanical properties result, in addition to the good superconducting properties.

The fanning-out of the carrier fiber bundle to form a ribbon of fibers laying side by side (linear arrangement of the individual fiber-cross sections) can be performed by the producer or by subsequent debraiding. In such a carrier fiber ribbon, the mutual shading of the individual fibers can largely be avoided, so that a homogeneous coating on all sides of the fibers becomes possible particularly if cathode sputtering is performed on both sides.

The cathode sputtering is advantageously performed reactively, i.e. with the simultaneous presence of nitrogen or a nitrogen-containing compound either in two stages or in one stage, to obtain a conductor as the end product which consists of a multiplicity of carrier fibers which are coated with a niobium carbonitride superconductor of finest grain (3 to 50 nm), and a layer thickness in the order of 1000 nm.

Advantageously, the reactive cathode sputtering takes place in a focusing magnetic field (magnetron) by means of which the plasma density is affected such that the electrons of the plasma are largely kept away from the substrate (fiber bundle). Thereby, undesired heating of the substrate is avoided and the grain growth is impeded, whereby the formation of an amorphous initial product is aided.

The conversion of the amorphous initial product into a fine-grained B1-structure can be accomplished by annealing by means of infrared radiation or another mode of heating, for instance in an oven or by an electron beam pulse or laser pulse.

As in the described CVD method, occlusions of insulating material can also be prepared by the physical vapor deposition methods on the grain boundaries of the superconducting grains, or by alloys increasing the conductivity of the superconducting grains. The same procedures as described with the CVD processes is used here analogously.

For preparing occlusions and grain boundary coatings of insulating material, suitable material can be applied onto the support fibers simultaneously with a niobium oxycarbonitride in a cathode sputtering reactor. To generate a layer-wise structure, in which superconducting and insulating layers follow each other alternatingly, the sputtering of the insulating material can take place alternatingly with the niobium oxycarbonitride application in a cathode sputtering reactor. The sputtering of the insulating material can, however, also be accomplished in a pulsating manner, while the niobium oxycarbonitride is applied continuously.

To increase the conductivity of the superconducting grains, an element increasing the conductivity such as tantalum or titanium, can be admixed with the source material for the cathode sputtering.

Electric stabilization of the superconducting fibers and contacting surfaces are provided by coating the fibers with high purity copper or aluminum, preferably after the superconducting layer has been applied to the carrier fibers by one of the methods described according to the invention, in a further process step following immediately. This coating can be accomplished, for instance, by a chemical process (for instance currentless wet chemical process of CVD method) which makes possible simultaneous and uniform copper plating or coating with aluminum of all fibers of the fiber bundle. A thermal post-treatment of the copper improves its conductivity. If the fiber bundle is fanned out, an electrolytic coating process or vapor deposition is suitable for coating with copper or aluminum, since in this case the individual fibers do not shield or cover each other.

In a further embodiment of the method for manufacturing superconducting fiber bundles the deposition is carried out in a continuous process, in which the carrier fibers are unwound from a row material coil and are transported through the coating system and the coated fibers are wound on a take-up spool. The method can also be carried out in several steps (for instance two continuous passes through the coating system). Underpressure or subatmospheric pressure or vacuum can be brought about by a strong suction of a vacuum pump. The lack of locks in the coating system is of advantage since it avoids the flow-in or impurities from the outside air. The two spools can be accommodated in underpressure vessel which can be flanged directly to the coating system without locks.

The invention as well as advantageous further embodiments will be explained and described, making reference to the drawing.

In FIG. 1 part of the cross section of a carrier fiber 1, for instance a carbon fiber covered with a superconducting layer 2 is schematically shown, greatly magnified. The superconducting layer 2 is in turn covered with a layer 3 of high-purity copper. The superconducting layer 2 consists of a mixture of superconducting grains 4 and grains 5 of insulating material. The superconducting grains 4 are B1-structure niobium oxycarbonitride crystals, the grain size of which is between 3 and 50 nm, i.e. more than 3 and less than 50 nm, and the chemical formula of which can be described by $NbC_xN_yO_z$ ($x+y+z$ smaller than or equal to 1). The insulating grains 5 consist of niobium dioxide $NbO_2$. However, they may also contain, as mentioned in the introduction to the specification, another oxide, carbide or nitride. The insulating grains 5 each have a size which corresponds approximately to the coherence length of the superconductor. They rest against the grain boundaries of the superconducting grains 4 and act as pinning grains. The thickness of the superconducting layer 2 is between 100 and 2000 nm, i.e. more than 100 and less than 2000 nm.

Figure 2:
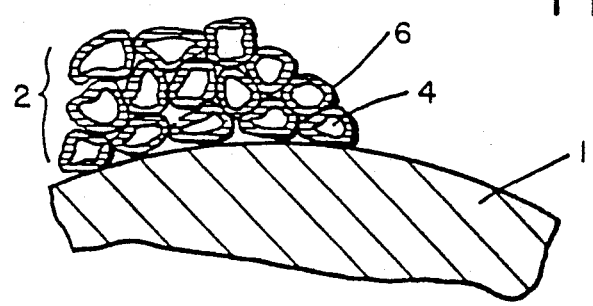
FIGS. 2 and 3 each show the partial region of a superconducting layer containing the superconducting grains and insulating material.

FIG. 2 shows a partial region of a superconducting layer 2 in which the superconducting grains 4 are covered by niobium dioxide or another insulating material 6. The insulating material 6 is deposited substantially at all grain boundaries of the B1-structure niobium oxycarbonitride grains 4, independently of the spatial orientation.

Figure 3:
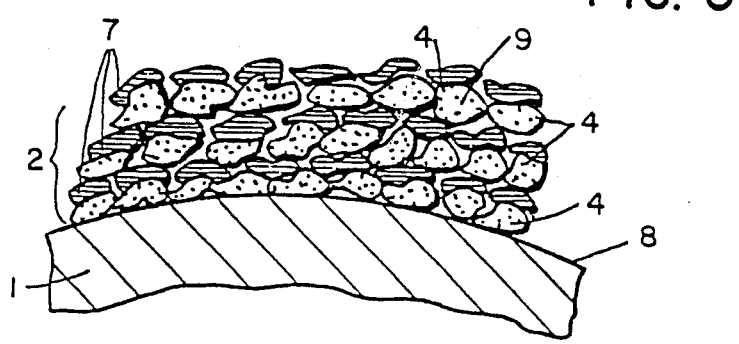

FIG. 3 also shows a partial region of a superconducting layer 2 in which the superconducting layer 2 is a stratified structure having alternate layers of superconducting grains 4 and layers of insulating material 7 (for instance niobium dioxide). The occlusions of insulating material 7 therefore do not cover all grain boundaries of the B1-structure niobium oxycarbonitride grains 4 but cover only grain boundaries which have an orientation with the superconducting layer 2 and lie parallel to the surface 8 of the carrier fiber 1. The superconducting grains 4 of niobium oxycarbonitride also contain an element 9, for instance tantalum or titanium, which increases the conductivity, which is indicated by dots within the grains 4.

Figure 4:
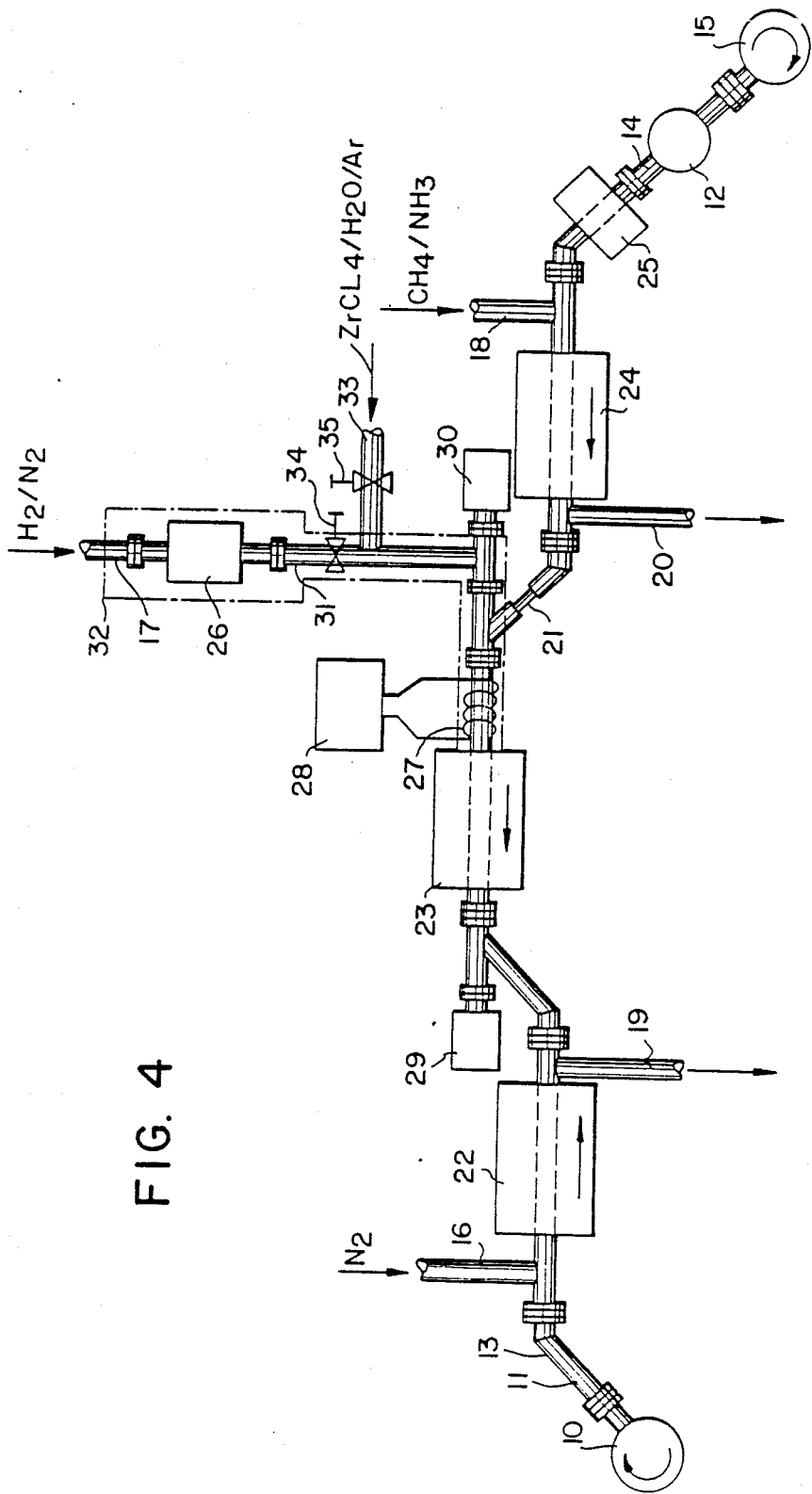
FIG. 4 shows a schematic view of a CVD apparatus for NbCN coating of C-fibers.

FIG. 4 shows deposition apparatus by means of which a superconducting fiber bundle according to the invention can be manufactured by niobium oxycarbonitride deposition on carbon fibers and subsequent copper plating of the individual fibers.

In an unwinding chamber 20 is a raw material spool which carries the uncoated carrier fibers 11 (carbon fibers). The carrier fibers 11 are pulled by a fiber transport device 12 through a repeatedly angled-off quartz tube 13 in which the coating of the carrier fibers 22 is carried out. The coated fibers 14 are then wound on a wind-up coil located in a wind-up chamber 15. In the quartz tube 13 there are three gas-inlet stubs 16, 17, 18 through which nitrogen $N_2$, a mixture of hydrogen and nitrogen $H_2/N_2$ or a mixture of methane an ammonia $Ch_4/NH_3$ can be admitted to the quartz tube 13. The gas contained within the quartz tube 13 can be suctioned off through two pump stubs 19, 20, and underpressure produced in quartz tube 13. The section of the quartz tube 13 which is upstream from the flow direction of fiber 11 from choke point 21 may be maintained at a pressure different from the section of quartz tube 13 which is downstream from choke point 21. Choke point 21 is a constriction through which the fiber bundle can be pulled but which prevents pressure equalization in the quartz tube 13 thereby permitting two different pressures within the quartz tube 13 before and after the choke point 21.

During transportation from the unwind chamber 10 to the wind-up chamber 15, the fiber bundle passes through four ovens 22, 23, 24, 25. In the first oven 22, the carbon fibers 11 are purified if required by being heated-up in a nitrogen or hydrogen atmosphere. The quantity of gas flowing into the gas inlet stub 16 is, for instance 1 to 20 liters per hour. The oven temperature is set to 600° to 1000° C.

In the second oven 23 (CVD reactor), the fibers are coated with a niobium-containing compound from an $NbCl_5$—$H_2$—$N_2$ gas mixture. For this purpose, a hydrogen-nitrogen mixture flows through the gas inlet stub 17 into the quartz tube 13 with an input quantity which is between 2 and 20 liters per hour. The $NbCl_5$ is converted from a solid evaporator 26, which however, may also be replaced by an evaporator from the liquid phase, into the gaseous phase and is conducted with the hydrogen-nitrogen mixture into the reactor. The temperature of the solid evaporator is set to a value between 80° and 200° C. The niobium chloride, however, can also be prepared by direct chlorination of niobium. The temperature of the oven 23 is between 600° and 1000° C. The residual gas is pumped-off through the pumping stub 19.

In the third oven 24, the second state of the CVD process for preparing the superconducting layer takes place. Through the gas-inlet stub 18, a carbon and nitrogen-containing gas mixture (for instance 0 to 50 volume percent methane, 0 to 50 volume percent ammonia and the remainder, nitrogen) is admitted into the quartz tube 13. The inflow quantity of methane and ammonia is each between 2 and 15 liters per hour. The third oven 24 is set to a temperature between 700° and 1100° C. In the process, the methane and ammonia gases are dissociated and carbon and nitrogen penetrate into the niobium layer. The residual gas is drawn off via the pumping stub 20.

In principle, the deposition apparatus can also operate single-stage, i.e., niobium is simultaneously deposited in the oven 23 and is carbonitrated in a carbon and nitrogen-containing atmosphere. The quartz tube 13 (reactor) and the gas supply are designed by suitably arranged flow resistances (choke point 21) and suitable design of the pumps which are connected to the pumping stubs 19, 20 to effect flow of the gases in the arrow directions in the ovens 22, 23, 24.

The niobium is deposited in the oven 23 with plasma activation. For this purpose, the oven 23 is preceded by an RF-coil 27 (according to the direction of the gas flow in the quartz tube). The RF-coil 27 is fed by an RF-generator 28 with a frequency of 13.65 MHz. The power of the RF-generator 28 is, for instance, between 5 and 100 watts. The coil 27 has, for instance, a length of 80 mm, a diameter of 55 mm and carries 13 turns. The plasma activation can also be accomplished capacitively or by a d-c discharge, which is not shown. For this purpose, two metal rods or plates which are disposed radially opposite each other are arranged as electrodes. The reactants (gases) are brought to an excited or ionized state within the quartz tube 13 by the RF-coil or the electrodes. The gas discharge can be excited continuously or pulse-wise.

The niobium deposition in the oven 23 can also take place under the action of an ultrasonic field. The ultrasonic field can be generated, for instance, by a piezo-crystal 29 which emits soundwaves progressing in the fiber direction. The sound waves are reflected at sound reflector 30 to effect the development of standing sound waves. It has been found that the development of standing sound waves is not necessary for the deposition of niobium and that the ultrasound can also be fed-in via angled-off stubs. Therefore, the quartz tube 13 can also be designed in straight form without angles, whereby several deflections of the fiber bundle can be dispensed with a compared to the deposition apparatus shown. The niobium can be deposited at a sound pressure level of between 10 and 30 dB and a frequency of between 15 and 20 kHz.

The quartz tube 31 between the solid evaporator 26 and the oven 23 is advantageously thermally stabilized to maintain the gas temperature. Thermal stabilization indicated by a dash-dotted line 32 may take the form of a heating and cooling jacket and in some instances a covering of thermal insulation may be adequate.

In the oven 25, the superconducting layers of the fiber bundle are coated with a highly conductive copper layer. This is accomplished by a CVD process, in which copper is deposited on the fibers from the gaseous phase. The oven 24 can be adjusted so that the fibers are colder than the copper to be deposited.

In the following, some process parameters will be listed which are advantageous for the deposition apparatus shown:

| Temperatures: | $T_{NbCl_5(column)} = 113°$ C. |
|---|---|
| | $T_{evaporator} = 138°$ C. |
| | $T_{oven\ 22} = 1000°$ C. |
| | $T_{oven\ 23} = 970°$ C. |
| | $T_{oven\ 24} = 1100°$ C. |
| Pressure: | $p = 0.8$ mbar |
| Quantities of Gas Inflow: | $i_{16}(N_2) = 1.2\ lh^{-1}$ |
| | $i_{17}(N_2) = 2.4\ lh^{-1}$ |
| | $i_{17}(N_2) = 2.4\ lh^{-1}$ |
| | $i_{18}(NH_3) = 2.4\ lh^{-1}$ |
| | $i_{18}(CH_4) = 2.4\ lh^{-1}$ |
| Fiber Velocity: | $V_{fiber} = 6$ cm min$^{-1}$ |
| RF- Generator Power: | $N = 40$ Watt |
| RF- Frequency: | $f = 13.65$ MHz |
| Sound Pressure Level: | $S = 15$ dB |
| Sound Frequency: | $f_S = 18$ kHz |

In the deposition apparatus according to FIG. 4, a further quartz tube 33 is flanged-on at the quartz tube 31 which is located between the solid evaporator 26 and the oven 23. The zirconium tetrachloride ZrCl$_4$, water H$_2$O and the carrier gas argon Ar can be fed into the deposition apparatus through tube 33. The addition of these gases serves for preparing grain structures with occlusions of insulating materials (ZrO$_2$) at the grain boundaries of the superconducting grains. For this purpose, other compounds can also be fed into the quartz tube 33. Insulating occlusions can be deposited, for instance, by the following reactions from the gaseous phase.

$$ZrCl_4 + 2H_2O \rightarrow ZrO_2 + 4HCl \quad (1)$$

$$TiCl_4 + 2H_2O \rightarrow TiO_2 + 4HCl \quad (2)$$

$$NbCl_4 + H_2O \rightarrow NbO_2 + 4HCl \quad (3)$$

$$Si(CH_3)Cl_3 \rightarrow SiC + \ldots \quad (4)$$

$$TiCl_4 + CH_4 \rightarrow TiC + \ldots \quad (5)$$

$$TiCl_4 + NH_3 \rightarrow TiN + \ldots \quad (6)$$

wherein principle, the H$_2$O can also be produced in the reactions 1 to 3 by the reaction $$CO_2 + H_2 \rightarrow CO + H_2O$$

in the reactor. The reaction temperatures are between 1000° and 1100° C., i.e. in the same range as the niobium oxycarbonitride deposition. A carrier gas (for instance argon) is advantageously admixed to the reaction gases, whereby the dosing and the concentration of the reaction gases in the deposition apparatus can be adjusted with better precision.

The insulated materials can be deposited in different ways in connection with the niobium oxycarbonitride layer:

1. The deposition of the insulating materials in accomplished simultaneously with the niobium oxycarbonitride deposition, by feeding the corresponding gases into the reactor (oven 23) through the two quartz tube 31 and 33. In this process, an insulating deposit is precipitated on all grain boundaries of the superconducting grains or as a grainy occlusion between the superconducting grains.

2. The deposition of superconducting and insulating material alternates. For such a procedure, a shutoff valve 34 and a shut off valve 35 which can be periodically opened and closed in opposite senses, are inserted in the quartz tubes 31 and 33 respectively. The superconducting and the insulating material are applied to the carrier fiber in layers, for instance in accordance with FIG. 3.

3. For a layer-wise application of superconducting and insulating layers, an operation of the deposition apparatus is also suitable, in which the shutoff valve 34 remains open continuously and only the shutoff valve 35 is periodically opened and closed (pulsating operation).

Tantalum pentachloride TaCl$_5$ or titanium tetrachloride TiCl$_4$ can also be added through the quartz tube 33 to the reaction mixture simultaneously during the niobium oxycarbonitride deposition. In the CVD deposition, tantalum Ta or titanium Ti, respectively, is deposited in the superconducting grains due to this addition. These elements have the property of increasing the conductivity of the superconducting grains without changing the value of the critical magnetic field H$_{C2}$ substantially.

Figure 5:
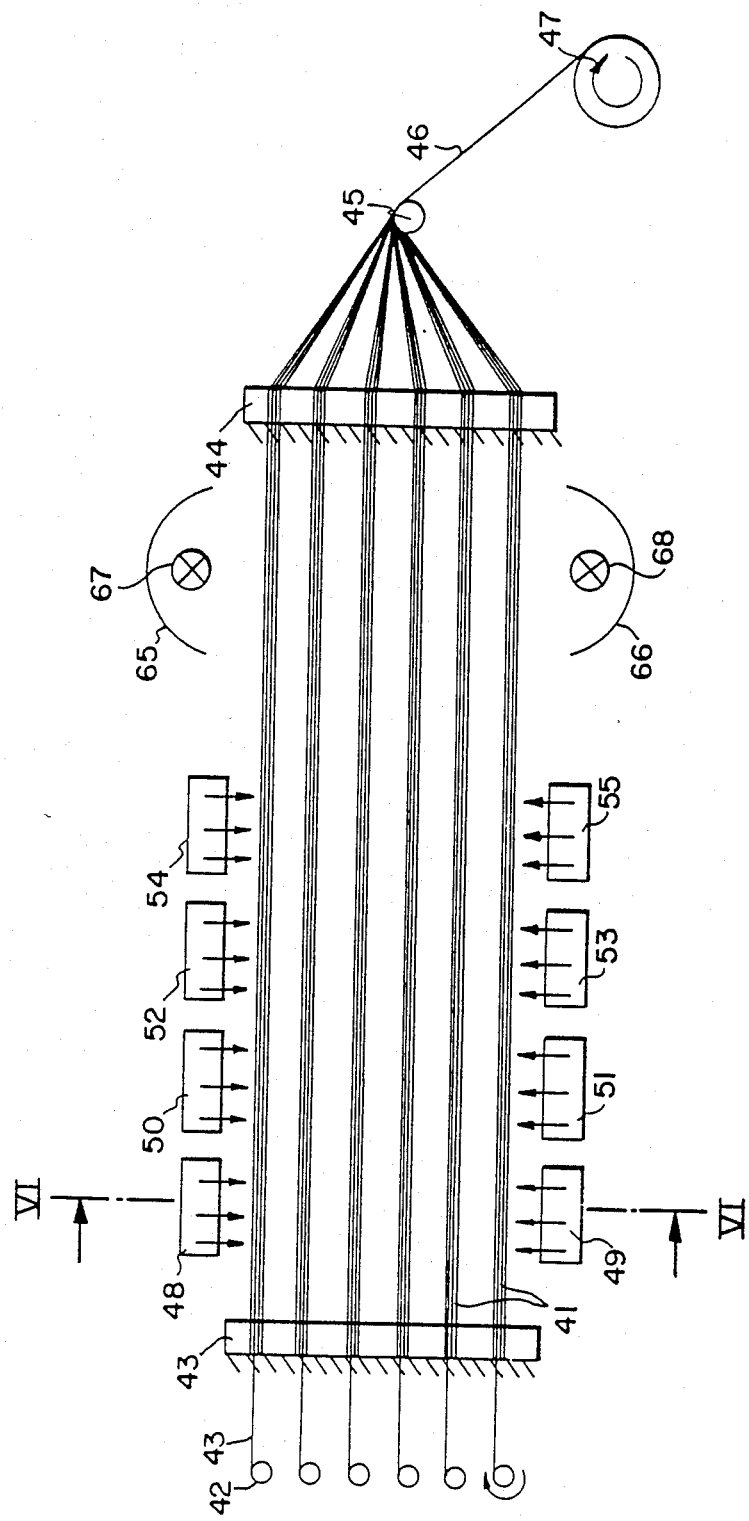
FIG. 5 shows a device for fanning-out and coating the carrier fibers and an evaporation device for coating the carrier fiber ribbon.

If the carrier fibers are to be coated by a physical process such as reactive cathode sputtering, the carrier fiber bundle must be fanned-out into a carrier fiber ribbon, as mentioned at the outset. FIG. 5 shows a device for fanning-out the carrier fibers 40 to form a carrier fiber ribbon 41. The carrier fibers 40 are unwound from several raw material spools 42 on each of which a multiplicity of parallel carrier fibers 40 combined in a carrier fiber bundle are wound and are pulled through a first comb 43. The comb 43 fans-out the uncoated carrier fibers 40 to form a carrier fiber ribbon 41. Between the first comb 43 and a second comb 44, the individual carrier fibers are substantially parallel and are disposed side by side in one plane. In the region of the carrier fiber ribbon 41, the carrier fibers 40 are physically coated with a superconducting niobium oxycarbonitride layer. Optionally, a coating of the fibers with high purity copper or aluminum can also be accomplished in a region in which the fibers are fanned-out in this manner if a physical process is to be used for the latter purpose. A deflection roll 45 combines the carrier fiber ribbon 41 into a coated fiber bundle 46. The fiber bundle 46 is wound on a take-up reel 47.

Between the two combs 43 and 44, the carrier fiber ribbon 41 passes through an evaporation device for coating the carrier fibers 40 with a superconducting niobium oxycarbonitride layer. The carrier fiber ribbon 41 passes through several (four, according to FIG. 5) atomizing systems 48, 49, 50, 51, 52, 53, 55 which are shown in FIG. 5 at the edges of the carrier fiber ribbon for better clarity but are actually arranged on both sides of the plane defined by the carrier fiber ribbon 41, which in seen in FIG. 6 which shows a cross section VI—VI through two atomizing systems 48 and 49.

Figure 6:
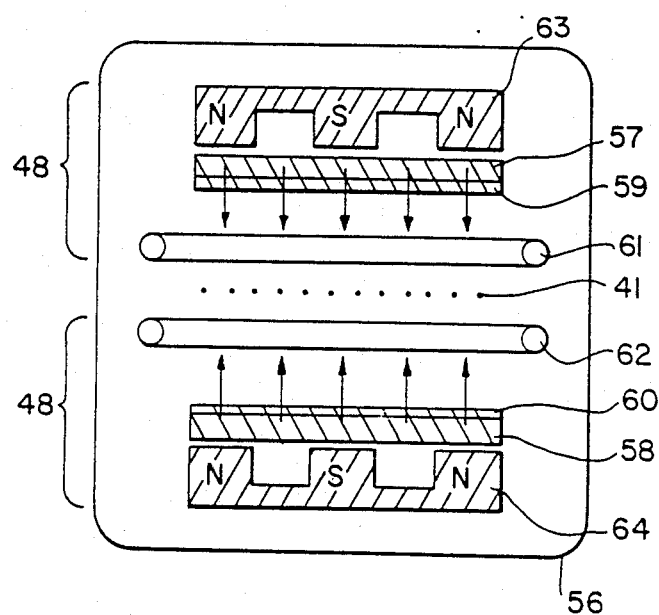
FIG. 6 is a cross section of the evaporating device taken along line VI—VI of FIG. 5.

FIG. 6 shows the wall 56 of a reactor which is filled with the carrier gas argon Ar at an underpressure of a few mbar to maintain the plasma. The fanned-out carrier fiber bundle 41 is pulled through the reactor. On both sides of the plane defined by the carrier fiber ribbon 41 are arranged two atomizing systems 48, 49. Each atomizing system 48, 49 consists of a sintered niobium oxycarbonitride target 59, 60 placed n a cathode 57, 58, as well as of an anode 61, 62. The niobium oxycarbonitride is sputtered in the direction of the arrow. On the side of the cathode 57, 58 facing away from the carrier fiber ribbon 41 there is a magnetic arrangement 63, 64. The magnet arrangement 63, 64 is shown in cross section. It may be designed, for instance as a ring arrangement in which a south pole S is developed in the center, which is surrounded in ring-fashion by several north poles N. The purpose of this magnet arrangement 63, 64 is to concentrate the plasma immediately in front of a cathode. The electrons liberated in the sputtering flow either toward the anodes 61, 62 arranged in the immediate vicinity of the cathode or to the wall 56 of the reactor. The carrier fiber ribbon 41 is exposed to the material flow of the sputtering material (niobium oxycarbonitride) and only in a small measure to the bombardment by secondary electrons. In this manner, undesirable heating of the substrate (carrier fiber ribbon) can be avoided.

For making a multilayer structure of the superconducting layer, the evaporation device consists, as shown in FIG. 5, of several sputtering system, 48, 49, 50, 51, 52, 53, 54, 55 which are arranged in series. In the first and third set of sputtering systems 48, 49, 52, 53, coating with niobium oxycarbonitride is accomplished. In the second and fourth set of the sputtering systems 50, 51, 54, 55, the target contains insulating material so that here, an insulating layer is applied between each two superconducting layers. Insulating materials which may be employed here (as with the CVD process), are oxides ($ZrO_2$, $TiO_2$, $NbO_2$) carbides (SiC, TiC) or nitrides (TiN).

With the evaporation device described, a superconducting layer can be applied to the carrier fibers, in which the insulating occlusions are distributed uniformly in the superconducting layer. For this purpose, a suitable mixed target of niobium carbonitride and a suitable insulating material is used.

If a mixed target is used which contains, in addition to the niobium oxycarbonitride, an element such as tantalum Ta or titanium Ti, a superconducting layer can be produced, the superconducting material of which contains besides the niobium oxycarbonitride, a further element which increases the conductivity of the superconducting grains.

Following the physical coating, the carrier fiber ribbon 41 passes through a heat treating device which, according to FIG. 5, is formed by two infrared radiators 67, 68 provided with reflectors 65, 66. The thermal conditions are set so that the amorphous niobium oxycarbonitride compounds which was applied to the carrier fiber ribbon 41 in the sputtering systems 48, 49, 52, 53 is converted into a fine-grained B1-structure, the average grain size of which is between 3 and 50 nm. The coated fiber bundle is heated, for instance, for about 10 minutes to a temperature of 600° to 800° C.

Thus, the invention relates to a superconducting fiber bundle which contains a multiplicity of carrier fibers such as carbon fibers, boron fibers or steel fibers coated with a superconducting layer of a niobium compound of the general formula $NbC_xN_yO_z$ ($x+y+z$ less than or equal to 1). In order to obtain high values of the critical magnetic field strength and the critical current, a superconducting layer is used which consists of fine-grained B1-structure niobium oxycarbonitride, the means grain size of which is between 3 and 50 nm. By planned incorporation of insulating material into the superconducting layer, the formation of pinning centers can be aided. The niobium compound layer is prepared by means of chemical deposition from the gaseous phase, using plasma activation and/or an ultrasonic field and optionally, underpressure. As an alternative to the chemical manufacturing method, a physical method can be used in which a carrier fiber bundle is fanned-out into a carrier fiber ribbon and coating of the carrier fibers on all sides with niobium oxycarbonitride by cathode sputtering follows. Immediately subsequently to the superconducting coating, a further coating of the fibers with high-purity copper of aluminum can take place.

The foregoing is a description corresponding, in substance, to German applications P No. 32 288 729.1, dated July 31, 1982, and P No. 32 36 895.8 dated Oct. 6, 1982, international- priority of which is being claimed for the instant application and which is hereby made part of this application. Any material discrepancies between the foregoing specification and the specification of the aforementioned corresponding German applications are to be resolved in favor of the latter.

We claim:

1. Method for manufacturing a superconducting fiber bundle formed of a multiplicity of carrier fibers coated with a superconducting layer of a niobium compound selected from the group consisting of niobium oxycarbonitride of the general formula $NbC_xN_yO_z$ wherein $x+y+z$ is equal to or less than 1, said superconductive layer of niobium compound having a fine grained B1-structure and a mean grain size between 3 and 50 nm which comprises fanning-out a carrier fiber bundle into a carrier fiber ribbon, coating the carrier fibers on all sides with niobium compound by reactive sputtering of niobium, in the presence of nitrogen or a nitrogen compound and carbon or a carbon compound, and annealing the carrier fiber ribbon to aid in the deposit of the niobium compound in a polycrystalline structure, the carrier fibers being annealed directly before or during the coating by infrared radiation, the reactive cathode sputtering taking place in a focusing magnetic field through which the plasma density is affected such that the electrons of the plasma are largely kept away from the substrate, occlusions of insulating material being uniformly distributed between the B1 niobium compound grains of the superconducting layer by cathode sputtering simultaneously with the coating of the carrier fibers with niobium compound by cathode sputtering.

2. Method for manufacturing a superconducting fiber bundle formed of a multiplicity of carrier fibers coated with a superconducting layer of niobium compound selected from the group consisting of niobium oxycarbonitride of the general formula wherein $x+y+z$ is equal to or less than 1, said superconductive layer of niobium compound having a fine grained B1-structure and a mean grain size between 3 and 50 nm which comprises fanning out a carrier fiber bundle into a carrier fiber ribbon, coating the fanned out carrier fibers on all sides under a controlled temperature with niobium compound in amorphous form by cathode sputtering, using a sintered niobium oxycarbonitride target for the exact dosing of the non-metallic compound partners $O_2$, $N_2$ or C, and subsequently subjecting the amorphous niobium compound to a heat treatment to convert it into the fine-grained B1-structure, the cathode sputtering taking place in a focusing magnetic field through which the plasma density is affected such that the electrons of the plasma are largely kept away from the substrate, occlusions of insulating material being uniformly distributed between the B1 niobium compound grains of superconducting layer by cathode sputtering simultaneously with the coating of the carrier fibers with niobium compound by cathode sputtering.

3. Method according to claim 1, wherein occlusions of insulating material are deposited by cathode sputtering at grain boundaries of the B1-structure niobium compound grains with definite spatial orientation within the superconducting layer, and wherein a reactor for the cathode sputtering, the niobium compound and the insulating material are applied alternatingly to the carrier fibers.

4. Method according to claim 2, wherein occlusions of insulating material are deposited by cathode sputtering at grain boundaries of the B1-structure niobium compound grains with definite spatial orientation within the superconducting layer, and wherein in a reactor for the cathode sputtering, the niobium compound and the insulating material are applied alternatingly to the carrier fibers.

5. Method according to claim 1, wherein occlusions of insulating material are deposited at grain boundaries of the B1-structure niobium compound grains with definite spatial orientation within the superconductor layer, and wherein the carrier fibers are continuously coated with niobium carbonitride by cathode sputtering, and the insulating material is applied pulsewise by cathode sputtering to the carrier fibers.

6. Method according to claim 2, wherein occlusions of insulating material are deposited at grain boundaries of the B1-structure niobium compound grains with definite spatial orientation within the superconductor layer, and wherein the carrier fibers are continuously coated with niobium carbonitride by cathode sputtering, and the insulating material is applied pulsewide by cathode sputtering to the carrier fibers.

7. Method according to claim 1, wherein in a cathode sputtering reactor, an element increasing the conductivity is applied by cathode sputtering on the carrier fibers simultaneously with the niobium carbonitride coating.

8. Method according to claim 2, wherein in a cathode sputtering reactor, an element increasing the conductivity is applied by cathode sputtering on the carrier fibers simultaneously with the niobium carbonitride coating.

* * * * *